(12) United States Patent
Lee et al.

(10) Patent No.: US 7,551,358 B2
(45) Date of Patent: Jun. 23, 2009

(54) CAMERA MODULE HAVING AN ARRAY LENS

(75) Inventors: Sang Hyuck Lee, Gyunggi-do (KR); Ho Seop Jeong, Gyunggi-do (KR); Seok Cheon Lee, Gyunggi-do (KR); Ho Sik You, Gyunggi-do (KR); Sung Hyun Kim, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

(21) Appl. No.: 11/822,301

(22) Filed: Jul. 3, 2007

(65) Prior Publication Data
US 2008/0007623 A1      Jan. 10, 2008

(30) Foreign Application Priority Data
Jul. 5, 2006      (KR) ...................... 10-2006-0062932

(51) Int. Cl.
*G02B 27/10* (2006.01)
*G03B 21/60* (2006.01)

(52) U.S. Cl. ................. 359/621; 359/622; 359/455; 359/463; 250/396 R; 257/448

(58) Field of Classification Search ............. 359/619, 359/621–623, 626, 454–457, 460, 463, 464; 257/429, 431, 435, 440, 443, 448; 250/306, 250/396 R, 396 ML, 492.21–492.23; 353/31–34, 353/97; 349/5, 95
See application file for complete search history.

(56) References Cited

U.S. PATENT DOCUMENTS

| 5,444,520 | A  | * | 8/1995 | Murano ...................... 399/221 |
|---|---|---|---|---|
| 5,463,216 | A  | * | 10/1995 | Van Berkel ............... 250/208.1 |
| 5,504,602 | A  | * | 4/1996 | Farmer ....................... 349/112 |
| 5,617,131 | A  | * | 4/1997 | Murano et al. .............. 347/233 |
| 5,648,874 | A  | * | 7/1997 | Sawaki et al. ............... 359/622 |
| 5,768,023 | A  | * | 6/1998 | Sawaki et al. ............... 359/622 |
| 6,171,885 | B1 | * | 1/2001 | Fan et al. ...................... 438/70 |
| 6,373,635 | B1 | * | 4/2002 | Fujimoto et al. ............ 359/619 |
| 6,646,807 | B2 | * | 11/2003 | Yoshikawa et al. .......... 359/619 |
| 6,821,810 | B1 | * | 11/2004 | Hsiao et al. ................... 438/69 |
| 6,872,951 | B2 | * | 3/2005 | Yagi et al. ............... 250/396 R |
| 6,903,345 | B2 | * | 6/2005 | Ono et al. ............... 250/396 R |
| 6,965,153 | B1 | * | 11/2005 | Ono et al. ................... 257/448 |
| 7,060,592 | B2 | * | 6/2006 | Pan et al. .................... 438/458 |

FOREIGN PATENT DOCUMENTS

WO      2005/072370      8/2005

* cited by examiner

*Primary Examiner*—Loha Ben

(57) ABSTRACT

In a camera module having an array lens, a first lens group has at least two lenses. A second lens group has a plurality of lenses corresponding to the lenses of the first lens group, the second lens group stacked below the first lens group and interposing a spacer part therebetween. An image sensor has an imaging region where light passing through the first and second lens groups is imaged. Also, a shielding unit shields portions excluding apertures of the lenses of the first and second lens groups, the shielding unit disposed between the first and second lens groups. The camera module has a lower optical system along an optical axis for smaller size, keeps light refracted from an adjacent lens from affecting an image, blocks leakage of light for imaging and increases definition of the image through signal processing.

12 Claims, 4 Drawing Sheets

CAMERA MODULE HAVING AN ARRAY LENS

CLAIM OF PRIORITY

This application claims the benefit of Korean Patent Application No. 2006-62932 filed on Jul. 5, 2006, in the Korean Intellectual Property Office, the disclosure of which is incorporated herein by reference.

BACKGROUND OF THE INVENTION

1. Field of the Invention

The present invention relates to a camera module, more particularly, a camera module having an array lens, the camera module which has a lower optical system along an optical axis for smaller size, keeps light refracted from an adjacent lens from affecting an image, blocks leakage of light for imaging and increases definition of the image through signal processing.

2. Description of the Related Art

Recently, with development in the electronic telecommunication industry, a mobile wireless terminal (hereinafter "terminal") is increasingly reduced in weight and size and varied in function. Especially, a camera module based on a digital camera technology is incorporated into the terminal to be employed as a camera phone terminal with camera function. Through the commercially viable camera phone terminal, moving and still images of an object are photographed and stored, and transmitted to another person.

The camera module disposed integrally in this terminal is typically required to be small in size and light in weight. This camera module includes a plurality of lenses, a lens barrel where the lenses are sequentially arranged along an optical axis, a diffraction optical device diffracting light transmitted through the lenses and an image sensor where light transmitted through the diffraction optical device is imaged.

However, a rising demand for higher definition necessitates use of an image sensor with a high pixel number and increases the number of the lenses. In consequence, this complicates assembling of the lenses in the lens barrel and packaging of the lenses assembled in the lens barrel together with the image sensor. Also, the increasing number of the lenses enlarges the volume of the camera module.

To reduce the volume of the camera module and enhance definition, WO No. 2005/072370 discloses a manufacturing method of a camera module, in which a plurality of micro lenses are disposed coplanarly by a semiconductor process technology.

As shown in FIG. 1, the camera module 20 includes a lens group 22, a color filter 25, an image sensor 24 and a processor 30. The lens group 22 has a plurality of lenses 22a,22b,22c and 22d arranged in a 2×2 array on a surface or both surfaces of the camera module 20. The color filter 25 is disposed on a bottom surface of the lens group 22 which is stacked above another lens group. Light transmitted through the lenses 22a, 22b,22c and 22d and the color filter 25 is imaged on the image sensor 24.

Accordingly, the light passing through the lenses 22a,22b, 22c and 22d of the lens group 22 and the color filter 25 is imaged on an imaging region of the image sensor 24. Here, definition of an image formed in the image sensor is increased by moving the lenses by a half pixel.

In the meantime, when the light incident on an incident surface of the upper lens group 22 is refracted while passing through the lenses 22a,22b,22c and 22d, most of the light enters the lenses of the lower lens group along the same axis. However, the light refracted at a view angle greater than necessary is incident on an adjacent one of the lenses, thereby interfering with the normal incident light or leaking to an outer periphery of the lens group.

This interference and leakage of the light deteriorates definition of the image formed in the image sensor.

SUMMARY OF THE INVENTION

The present invention has been provided to solve the foregoing problems of the prior art and therefore an aspect of the present invention provides a camera module having an array lens which has a lower optical system along an optical axis for smaller size, keeps light refracted from an adjacent lens from affecting an image, blocks leakage of light for imaging and increases definition of the image through signal processing.

According to an aspect of the invention, the invention provides a camera module having an array lens, the module including a first lens group having at least two lenses; a second lens group having a plurality of lenses corresponding to the lenses of the first lens group, the second lens group stacked below the first lens group and interposing a spacer part therebetween; an image sensor having an imaging region where light passing through the first and second lens groups is imaged; and a shielding unit for shielding portions excluding apertures of the lenses of the first and second lens groups, the shielding unit disposed between the first and second lens groups.

The shielding unit may include a first shield formed on a light exiting surface of the first lens group to have first windows corresponding to the lenses of the first lens group; a second shield formed on a light incident surface of the second lens group to have second windows corresponding to the lenses of the second lens group.

Each of the first windows may have a circular shape, identical to each of the lenses formed in the shape of a circular cross-section.

Each of the first windows may have an inner diameter identical to or smaller than each of the apertures of the lenses.

Each of the second windows may have an inner diameter greater than an inner diameter of each of the first windows.

The first and second shields may be formed of a metal material deposited on surfaces of the first and second lens groups.

The first lens group may further include a third shield having third windows corresponding to the lenses of the first lens group.

Each of the third windows may have a square shape whose size is greater than each of the apertures of the lenses.

Each of the third windows may have at least one step formed on an inner surface thereof to reduce a size of an inner diameter of the third window.

Each of the third windows may have an inclined plane formed on an inner circumference thereof to reduce a size of an inner diameter of the third window.

The spacer part may include a first spacer disposed on an outer edge of the light exiting surface of the first lens group; a second spacer disposed on an outer edge of the light incident surface of the second lens group; and an adhesive interposed between the first and second spacers.

The image sensor may include a color filter on a top thereof to separate a monochromic light signal from light incident through the first and second lens groups.

The color filter may include a uniformly divided array filter corresponding to the uniformly divided imaging region to have filter regions identical to one another.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
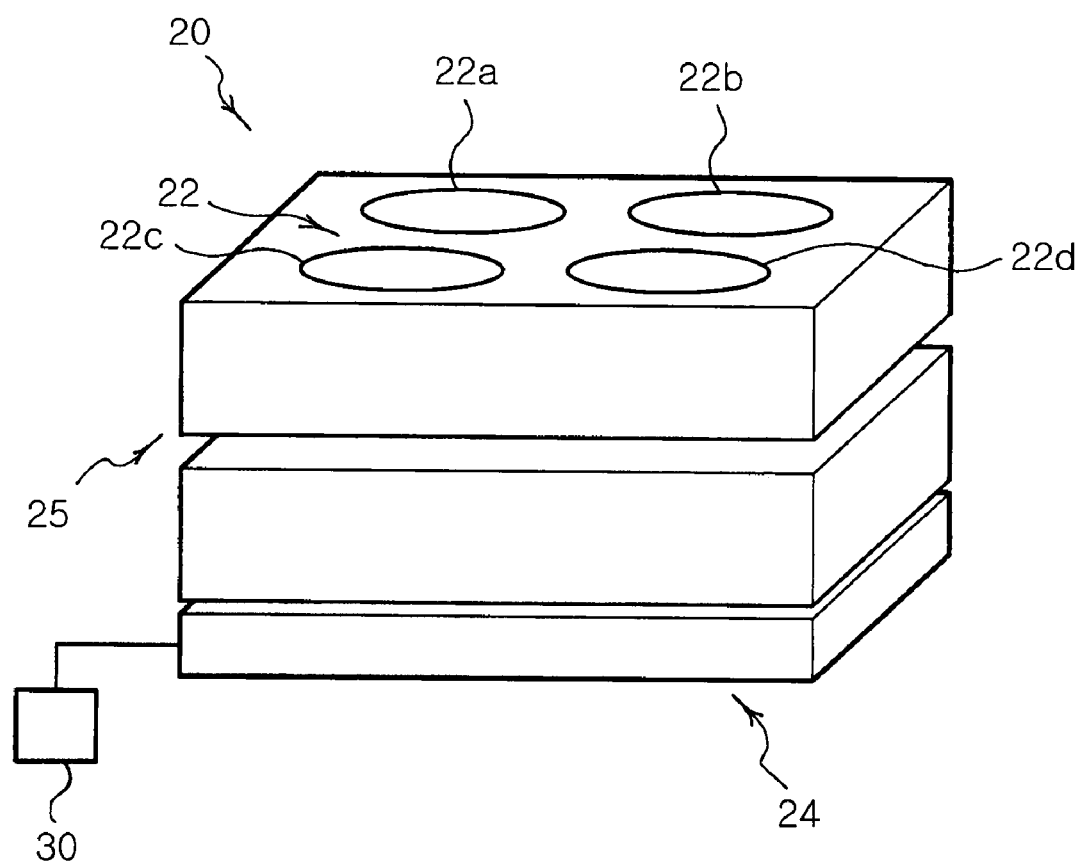
FIG. 1 is a perspective view illustrating a conventional camera module having an array lens.
Figure 2:
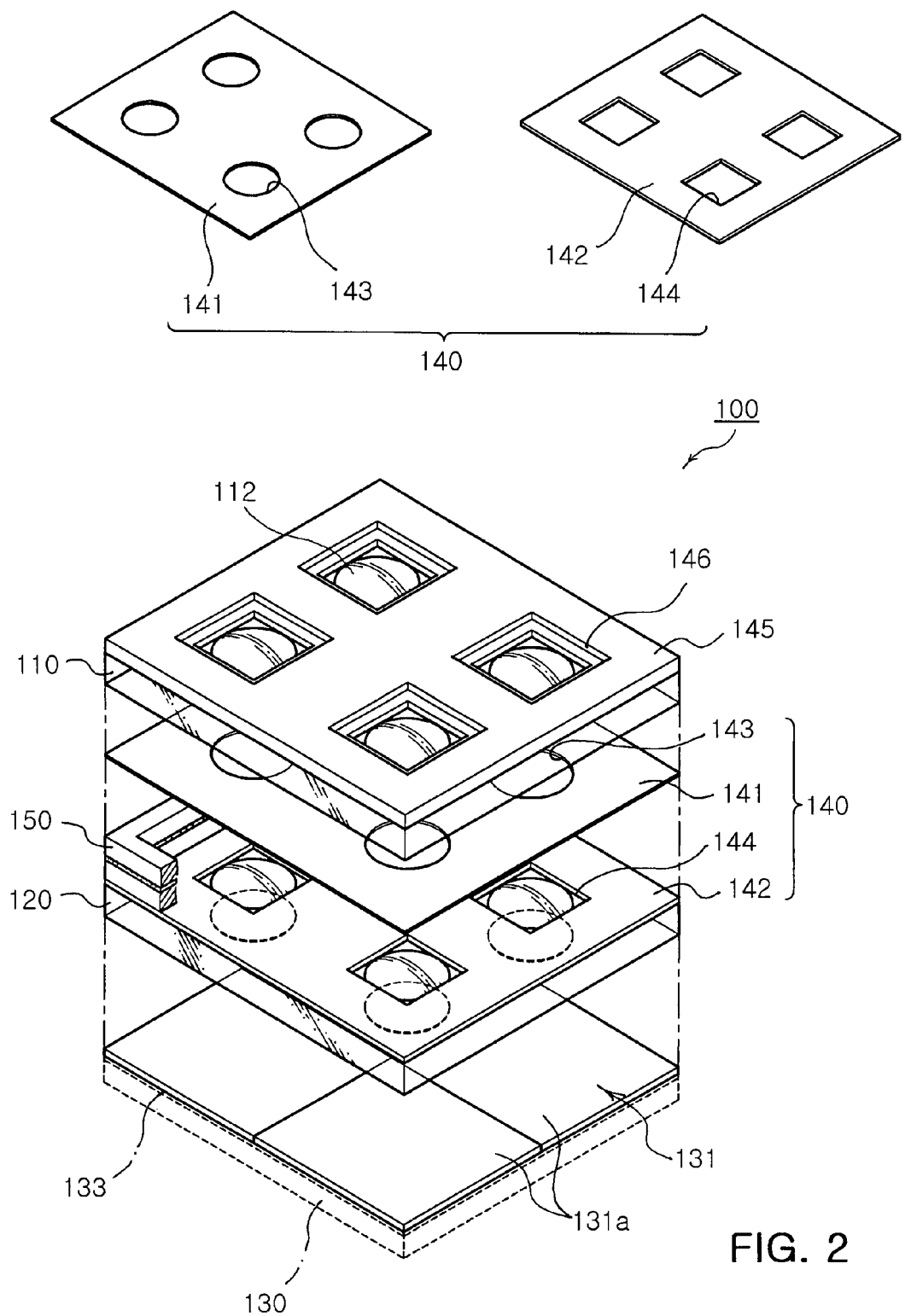
FIG. 2 is a perspective view illustrating a camera module having an array lens according to an exemplary embodiment of the invention.
Figure 3:
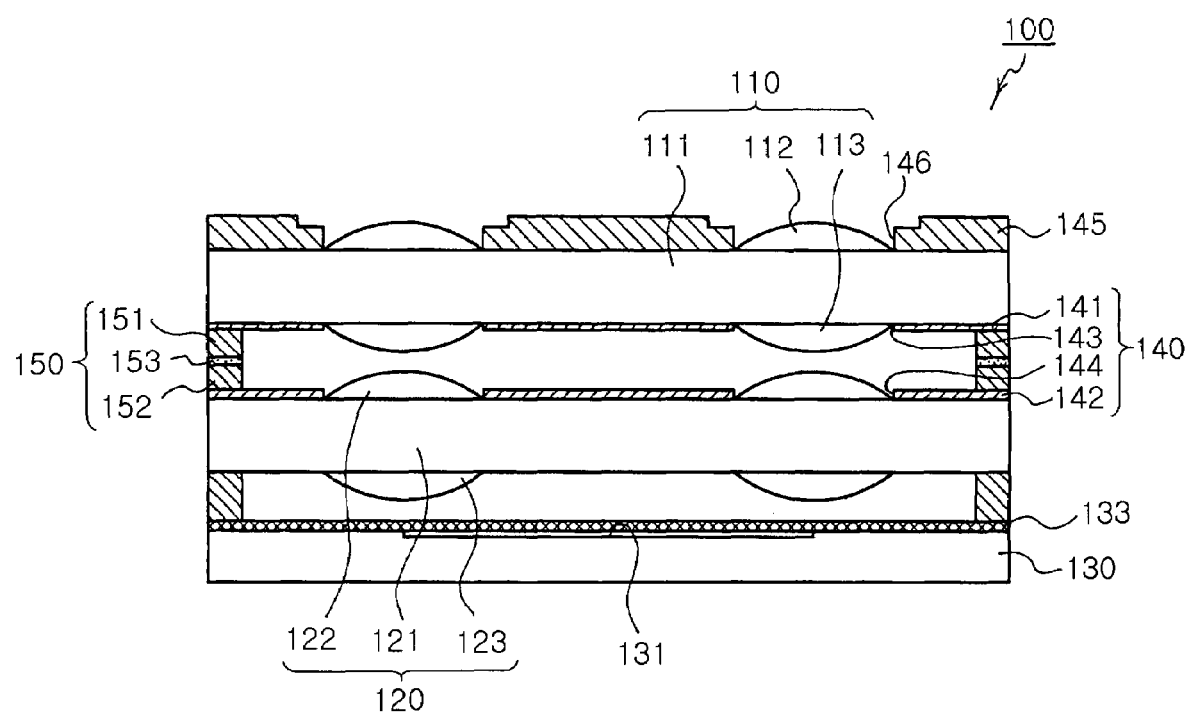
FIG. 3 is a cross-sectional view illustrating a camera module having an array lens according to an exemplary embodiment of the invention.

FIG. 2 is a perspective view illustrating a camera module having an array lens according to an exemplary embodiment of the invention and FIG. 3 is a cross-sectional view illustrating a camera module having an array lens according to an exemplary embodiment of the invention.

As shown in FIGS. 2 and 3, the camera module 100 of the present embodiment includes first and second lens groups 110 and 120, an image sensor 130 and a shielding unit 140.

The first lens group 110 has at least two first upper lenses 112 in one of convex and concave configurations on a light incident surface corresponding to a top surface of a first wafer 111.

A plurality of first lower lenses 113 are arranged in one of convex and concave configurations on a light exiting surface corresponding to an underside surface of the first wafer 111 to be center-aligned with the first upper lenses 112.

The second lens group 120 is an optical device stacked below the first lens group 110, interposing a spacer part 150 therebetween.

In the same manner as the first lens group 110, the second lens group 120 has at least two upper lenses 122 in one of convex and concave configurations on a light incident surface corresponding to a top surface of the second wafer 121. Also, a plurality of second lower lenses 123 are arranged in one of convex and concave configurations on a light exiting surface corresponding to an underside surface of the second wafer 121 to be center-aligned with the second upper lenses 122.

The spacer part 150 is interposed between the first lens group 110 and the second lens group 120, giving a certain distance between the first and second lenses 110 and 120. At the same time, the spacer part 150 interposed between the first and second lenses 110 and 120 may have a height adjusted to vary a gap between the first and second lenses 110 and 120. This enables adjustment in a focal length between the first lens group 110 and the image sensor 130.

The spacer part 150 includes a first spacer 151, a second spacer 52 and an adhesive 153 interposed therebetween. The first spacer 151 extends downward in a certain length from an outer edge of the light exiting surface of the first lens group 110. The second spacer 152 extends upward in a certain length from an outer edge of the light incident surface of the second lens group 120. The adhesive 153 is interposed between the first and second spacers 151 and 152 to fixedly adhere the first and second spacers 151 and 152.

Meanwhile to manufacture the lenses of the first and second lenses 110 and 120, a previously designed lens pattern is formed on the top surface of the wafer W and convex lenses L are formed by etching the wafer W as shown in FIG. 4 (a) or concave lenses L are formed by etching the wafer W as shown in FIG. 4 (b).

Figure 4A:
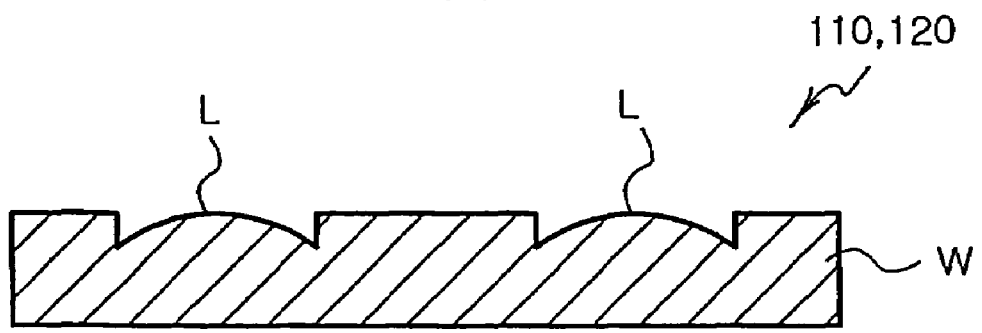
FIGS. 4(a), 4(b), 4(c) and 4(d) are configuration views illustrating a method of manufacturing a lens adopted in a camera module having an array lens according to an exemplary embodiment of the invention.
Figure 4B:
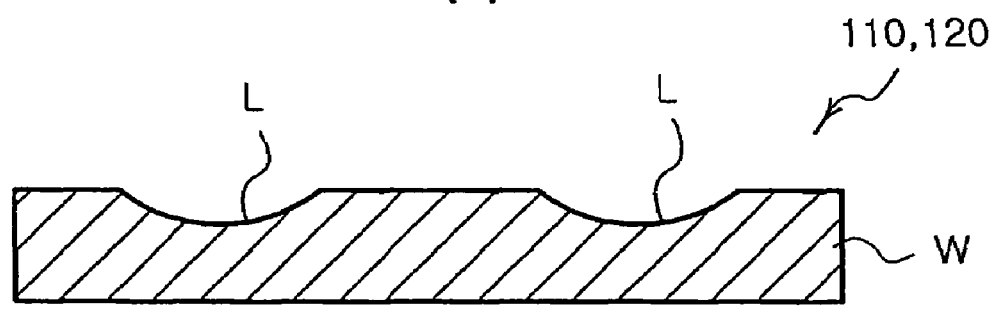
Figure 4C:
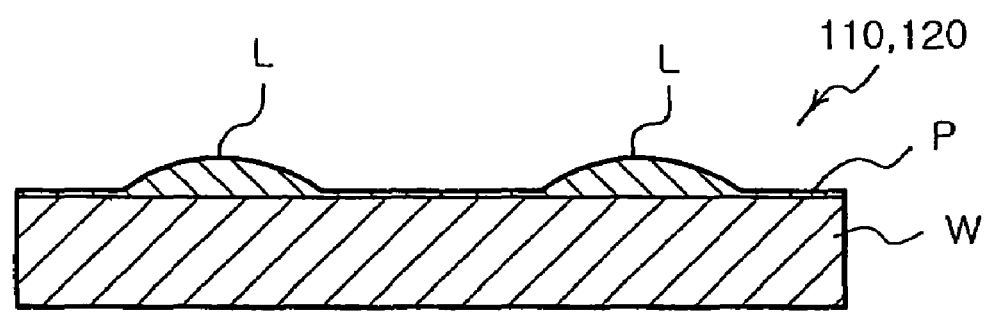
Figure 4D:
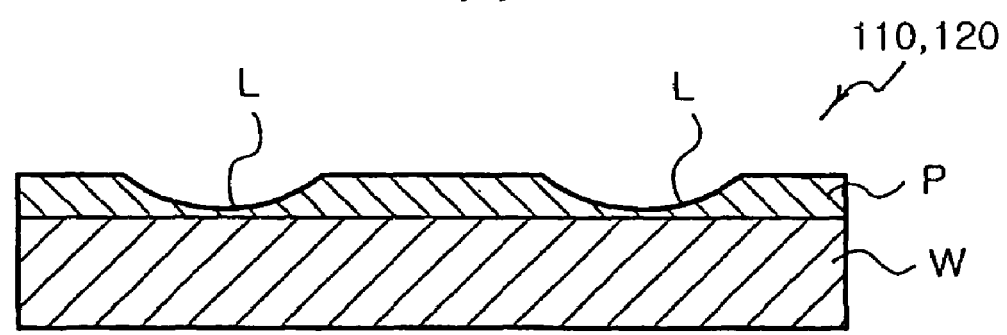

Alternatively, to manufacture the lenses of the first and second lenses 110 and 120, a polymer layer P with a certain thickness is stacked on the top surface of the wafer W and fabricated into convex lenses L as shown in FIG. 4(c) or concave lenses L as shown in FIG. 4(d) by a replica method using a previously designed lens mold.

Here, shapes of the lenses of the first and second lenses 110 and 120 are determined to be convex or concave according to a pre-designed optical system. The lenses L with determined shapes may be disposed on a surface of the wafer W as shown in FIGS. 4(a), 4(b), 4(c) and 4(d) but may be arranged on both surfaces of the wafer W according to the designing of the optical system.

Furthermore, as shown in FIG. 2, the lenses of the first and second lens groups 110 and 120 are configured into a uniformly divided 2×2 array corresponding to the uniformly divided 2×2 array of the imaging region of the image sensor 130. But the invention is not limited thereto.

Moreover, the first and second lens groups 110 and 120 stacked vertically, interposing the spacer part 150 are located inside the barrel (not shown) which is manufactured to suit the first and second lens groups 110 and 120.

The barrel includes an additional driving unit (not shown) such as a piezoelectric motor and an electric motor to allow the optical system of the first and lens groups 110 and 120 to reciprocally move along an optical axis, thereby performing zooming and focusing. Also, the barrel includes a driving force transmission unit (not shown) such as a screw and a gear.

The image sensor 130 is disposed just below the second lens group 120 and has the imaging region 131 on a top surface thereof in order to allow light to be imaged on a location where the light is refracted through the lenses of the first and second lens groups 110 and 120 and forms a focal point.

A color filter 133 is disposed on a top surface of the image sensor 130 provided with the imaging region 131 to separate a monochromic optical signal from the light incident through the first and second lens groups 110 and 120, that is, red, green and blue or yellow, magenta and cyan.

Here, the color filter 133 should be configured as a uniformly divided 2×2 array corresponding to the uniformly divided 2×2 array of imaging region to have filter regions identical to one another.

The shielding unit 140 is disposed between the first lens group 110 and the second lens group 120. The shielding unit 140 allows light to propagate only through apertures of the lenses 112, 113, 122 and 123 of the first and second lens groups 110 and 120, while shielding other portions excluding the apertures of the lenses.

The shielding unit 140 includes a first shield 141 formed on the underside surface of the first wafer 111 corresponding to the light exiting surface of the first lens group 110, and a second shield 142 formed on the top surface of the second wafer 121 corresponding to the light incident surface of the second lens group 120.

The first shield 141 has first windows 143 with a certain size formed corresponding to the arrays of the first lower lenses 113 in the first lens group 110.

Here, each of the first windows 143 formed in the first shield 141 is shaped in a circle, identical to each of the lenses of the first lens group 110 formed in the shape of a circular cross-section.

Also, each of the first windows 143 may have an inner diameter not greater than each of the apertures of the lenses. Accordingly, light passing through the first windows 143 is not incident on another adjacent one of the lenses on the same incident surface and does not interfere.

The second shield 142 has second windows 144 with a certain size formed corresponding to the arrays of the second upper lenses 122 in the second lens group 120.

Here, each of the second windows 144 formed in the second shield 142 may be center-aligned with the first window 141 and shaped as a square hole whose size is greater than each of the apertures of the first windows 143.

In consequence, light refracted through the lenses 122 and 123 of the second lens group 120 is emitted in a square shape, identical to the square shape of the second windows 144 of the second shield 142. Therefore, light is imaged without overlap on the uniformly divided square-shaped imaging region 131 of the image sensor 130.

Meanwhile, the first and second shields 141 and 142 are formed in the wafers 111 and 121, respectively which constitute the first and second lens groups 110 and 120, by depositing a metal material such as chrome on surfaces of the wafers 111 and 121.

Also, the first lens group 110 may be additionally provided on a light incident surface thereof with a third shield 145. The third shield 145 has third windows 146 with a certain size formed corresponding to the first upper lenses 112.

Each of the third windows 146 of the third shield 145 is shaped as a square hole having an inner diameter greater than each of the apertures of the first upper lenses 112. The third window 146 may have at least one step formed on an inner surface thereof to reduce a size of an inner diameter of the third window in a light incident direction. Alternatively, the third window 146 may have an inclined plane formed on an inner circumference thereof.

Accordingly, unnecessary light out of the apertures of the lenses of the first lens group 110 does not enter the light incident surface thereof.

In the same manner as the first and second shields 141 and 142, to form the third shield 145, a metal material such as chrome is deposited on a top surface of the wafer 111.

In the camera module 100 configured as above, the first lens group 110 includes the uniformly divided 2×2 arrays of first upper lenses 112 and the uniformly divided 2×2 arrays of first lower lenses 113. Thus, when light becomes incident on the first lens group 110, the light is refracted through the first upper and lower lenses 112 and 113 and enters the second lens group 120 stacked below the first lens group 110 and interposing the spacer part 150 therebetween.

Here, when the light is incident on the light incident surface of the first lens group 110, a portion of the light deviating from the apertures of the first upper lenses 111 does not pass through the third windows 146 of the third shield 145.

Moreover, the first shield 141 is formed on the light exiting surface of the first lens group 110 to have the first windows 143 formed therein. Each of the first windows 143 has an inner diameter not greater than each of the apertures of the first upper and lower lenses 112 and 113. Therefore, a portion of the light refracted excessively through the first upper and lower lenses 112 and 113 of the first lens group 110 is not emitted to the second lens group 120 but shielded by the shielding unit.

As a result, light incident on the first lens group 110 outside a view angle thereof is prevented from entering the second lens group 120 unnecessarily.

Furthermore, the second shield 142 is formed on the light incident surface of the second lens group 120 to have the second windows 144 therein. Each of the second windows 144 has an inner diameter greater than each of the apertures of the lenses of the second lens group 120. Thus, when light becomes incident on the light incident surface of the second lens group 120, the light passes through the lenses 122 and 123 and is emitted in a square shape, identical to the square shape of the second windows 144. Therefore, the light is imaged without overlap on the uniformly divided square-shaped imaging region 131a of the image sensor 130.

Also, the color filter 133 divided to form a bayer pattern is disposed on the top surface of the image sensor 130. The color filter 133 is divided corresponding to the imaging region divided into a 2×2 array. The color filter divided into a 2×2 array 133 enables a plurality of monochromic images to be formed in the divided imaging region 131, in a size reduced by a quarter over a full-color image.

Subsequently, the monochromic images formed in divided portions of the imaging region of the image sensor 130 are synthesized and restored into a full-color image by a signal processing algorithm of a signal processor (not shown) electrically connected to the image sensor 130.

As set forth above, according to exemplary embodiments of the invention, a shielding unit is disposed between first and second lens groups to shield portions excluding apertures of lenses thereof. Thus, when light is refracted through the lenses of the first lens group, a portion of the light refracted in a view angle greater than necessary is prevented from entering lenses not corresponding to a light incident surface of the second lens group. Also, the light is prevented from being leaked to the outside. In consequence, the light refracted from an adjacent one of the lenses does not affect an image and is blocked from leaking. Moreover, the imaging region of the image sensor is greatly enhanced in its efficiency, thereby increasing definition of the image and improving optical properties of a camera.

In addition, a focal length between the lens groups and the image sensor is shortened to reduce a height of the optical system, leading to a more compact camera module and a smaller terminal adopting the cameral module.

While the present invention has been shown and described in connection with the preferred embodiments, it will be apparent to those skilled in the art that modifications and variations can be made without departing from the spirit and scope of the invention as defined by the appended claims.

What is claimed is:

1. A camera module having an array lens, the module comprising:
    a first lens group having at least two lenses, each having upper and lower lenses formed respectively on planar light entering and planar light exiting surfaces of a first wafer;
    a second lens group having a plurality of lenses, each having upper and lower lenses formed respectively on planar light entering and planar light exiting surfaces of a second wafer and arranged corresponding to the lenses of the first lens group, the second lens group stacked below the first lens group with a spacer part interposed therebetween, the spacer part having first and second spacers with an adhesive between them;
    an image sensor having an imaging region where light passing through the first and second lens groups is imaged; and a shielding unit for shielding portions excluding apertures of the lenses of the first lens group and the second lens group, wherein the shielding unit comprises a first shield formed on the planar light exiting surface of the first wafer, excluding the apertures of the lower lenses of the first lens group, to create first windows corresponding to the lenses of the first lens group; and a second shield formed on the planar light entering surface of the second wafer, excluding the apertures of the upper lenses of the second lens group, to create second windows corresponding to the lenses of the second lens group.

2. The camera module of claim 1, wherein each of the first windows has a circular shape, identical to each of the lenses formed in the shape of a circular cross-section.

3. The camera module of claim 1, wherein each of the first windows has an inner diameter identical to or smaller than each of the apertures of the lenses.

4. The camera module of claim 1, wherein each of the second windows has an inner diameter greater than an inner diameter of each of the first windows.

5. The camera module of claim 1, wherein the first and second shields are formed of a metal material deposited on the portions excluding apertures of the first and second lens groups.

6. The camera module of claim 1, wherein the first lens group further comprises a third shield having third windows corresponding to the lenses of the first lens group.

7. The camera module of claim 6, wherein each of the third windows has a square shape whose size is greater than each of the apertures of the lenses.

8. The camera module of claim 6, wherein each of the third windows has at least one step formed on an inner surface thereof to reduce a size of an inner diameter of the third window.

9. The camera module of claim 6, wherein each of the third windows has an inclined plane formed on an inner circumference thereof to reduce a size of an inner diameter of the third window.

10. The camera module of claim 1, wherein:

the first spacer is disposed on an outer edge of the planar light exiting surface of the first wafer; and the second spacer is disposed on an outer edge of the planar light entering surface of the second wafer.

11. The camera module of claim 1, wherein the image sensor comprises a color filter on a top thereof to separate a monochromic light signal from light incident through the first and second lens groups.

12. The camera module of claim 11, wherein the color filter comprises a uniformly divided array filter corresponding to the uniformly divided imaging region to have filter regions identical to one another.

* * * * *